(12) United States Patent
Hwang et al.

(10) Patent No.: US 9,130,125 B2
(45) Date of Patent: Sep. 8, 2015

(54) SEMICONDUCTOR LIGHT EMITTING DEVICE

(75) Inventors: Seok Min Hwang, Pusan (KR); Hae Soo Ha, Suwon-si (KR); Jae Yoon Kim, Yongin-si (KR); Jae Ho Han, Daejeon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 28 days.

(21) Appl. No.: 14/237,461

(22) PCT Filed: Aug. 17, 2011

(86) PCT No.: PCT/KR2011/006039
§ 371 (c)(1),
(2), (4) Date: Feb. 6, 2014

(87) PCT Pub. No.: WO2013/024921
PCT Pub. Date: Feb. 21, 2013

(65) Prior Publication Data
US 2014/0175503 A1 Jun. 26, 2014

(51) Int. Cl.
*H01L 33/38* (2010.01)
*H01L 33/20* (2010.01)

(52) U.S. Cl.
CPC ............... *H01L 33/38* (2013.01); *H01L 33/20* (2013.01)

(58) Field of Classification Search
CPC ........ H01L 33/20; H01L 33/38; H01L 33/387
See application file for complete search history.

(56) References Cited

U.S. PATENT DOCUMENTS

| 6,307,218 B1 | 10/2001 | Steigerwald et al. |
| 6,614,056 B1 | 9/2003 | Tarsa et al. |
| 6,650,018 B1 | 11/2003 | Zhao et al. |
| 6,777,805 B2 | 8/2004 | Uemura et al. |

(Continued)

FOREIGN PATENT DOCUMENTS

| JP | 2001-345480 A | 12/2001 |
| KR | 2002-0068363 A | 8/2002 |

(Continued)

OTHER PUBLICATIONS

International Search report for PCT/KR2011/006039 dated Apr. 15, 2012.

(Continued)

*Primary Examiner* — Duy T Nguyen
*Assistant Examiner* — Mounir Amer
(74) *Attorney, Agent, or Firm* — Harness, Dickey & Pierce, P.L.C.

(57) ABSTRACT

A semiconductor light emitting device may include an n-type semiconductor layer, an active layer and a p-type semiconductor layer disposed in a first region corresponding to a portion of an upper surface of the n-type semiconductor layer, an n-type electrode formed in a second region distinct from the first region on the n-type semiconductor layer to be electrically connected to the n-type semiconductor layer and including an n-type electrode pad and first and second n-type electrode fingers, and a p-type electrode formed on the p-type semiconductor layer to be electrically connected to the p-type semiconductor layer and including a p-type electrode pad and a p-type electrode finger. A distance between n-type and p-type electrodes may be constant to significantly reduce a phenomenon of concentration of a current in a specific region of an electrode.

19 Claims, 8 Drawing Sheets

(56) References Cited

U.S. PATENT DOCUMENTS

| | | |
|---|---|---|
| 6,885,036 B2 | 4/2005 | Tarsa et al. |
| 7,042,089 B2 | 5/2006 | Uemura et al. |
| 2003/0107053 A1 | 6/2003 | Uemura et al. |
| 2004/0084684 A1 | 5/2004 | Tarsa et al. |
| 2004/0232454 A1 | 11/2004 | Uemura et al. |
| 2006/0192223 A1 | 8/2006 | Lee et al. |
| 2010/0006885 A1* | 1/2010 | Gong .............................. 257/99 |
| 2010/0140656 A1* | 6/2010 | Kim et al. ...................... 257/99 |
| 2010/0258836 A1 | 10/2010 | Wang et al. |
| 2011/0114990 A1* | 5/2011 | Kim et al. ...................... 257/99 |
| 2013/0134867 A1* | 5/2013 | Yang et al. .................... 313/499 |
| 2014/0077252 A1* | 3/2014 | Lim et al. ....................... 257/99 |

FOREIGN PATENT DOCUMENTS

| | | |
|---|---|---|
| KR | 2006-0095117 A | 8/2006 |
| KR | 10-0708934 B1 | 4/2007 |
| KR | 2011-0006778 A | 1/2011 |

OTHER PUBLICATIONS

Written Opinion for PCT/KR2011/006039 dated Apr. 16, 2012.

* cited by examiner

SEMICONDUCTOR LIGHT EMITTING DEVICE

This application is a national phase under 35 U.S.C. §371 of PCT International Application No. PCT/KR2011/006039 which has an International filing date of Aug. 17, 2011 the entire contents of which are hereby incorporated by reference.

TECHNICAL FIELD

The present disclosure relates to a semiconductor light emitting device.

BACKGROUND ART

Semiconductor light emitting devices are semiconductor devices capable of generating various colors of light through the recombination of electrons and holes at junctions between p-type semiconductor layers and n-type semiconductor layers when current is applied thereto. Since such semiconductor light emitting devices have positive properties such as relatively long lifespans, relatively low power consumption, excellent initial driving properties, high vibration resistance, and the like, as compared with filament-based light emitting elements, demand for such a semiconductor light emitting devices has risen. Recently, group III nitride semiconductors have been prominent as semiconductor devices capable of emitting blue light having a short wavelength.

Nitride single crystals configuring light emitting devices using such group III nitride semiconductors may be formed on specific growth substrates such as sapphire substrates or silicon carbide (SiC) substrates. However, when insulating substrates such as sapphire substrates are used, there may be significant restrictions on the alignment of electrodes. For example, in the case of nitride semiconductor light emitting devices according to the related art, since electrodes are generally aligned in a horizontal direction, narrow current flow may result therefrom. A level of an operating voltage Vf of light emitting devices may be increased due to such a narrow current flow, deteriorating current efficiency, and devices may be vulnerable to electrostatic discharge. In this case, in order to allow for uniform current distribution across the entire light emission surface, attempts to classify n-type and p-type electrodes as electrode pads and electrode fingers, respectively, to then be alternately disposed, and the like, have been undertaken. However, even in the case that electrode pads and electrode fingers are uniformly distributed, current may be concentrated in various portions of electrode pads. Therefore, a scheme capable of significantly reducing current concentrations in horizontal electrode structures is required.

DISCLOSURE

Technical Problem

An exemplary embodiment of the present disclosure may provide a semiconductor light emitting device able to significantly reduce a phenomenon in which a current is concentrated in a specific region of an electrode and lower a level of driving voltage through an improved electrode structure.

Technical Solution

According to an exemplary embodiment of the present disclosure, a semiconductor light emitting device may include an n-type semiconductor layer, an active layer and a p-type semiconductor layer disposed in a first region corresponding to a portion of an upper surface of the n-type semiconductor layer, an n-type electrode disposed in a second region distinct from the first region on the n-type semiconductor layer to be electrically connected to the n-type semiconductor layer and including an n-type electrode pad and first and second n-type electrode fingers, and a p-type electrode disposed on the p-type semiconductor layer to be electrically connected to the p-type semiconductor layer and including a p-type electrode pad and a p-type electrode finger. The n-type semiconductor layer, the active layer and the p-type semiconductor layer may configure a light emitting structure. The n-type electrode pad may be disposed inside of a light emission surface provided when the light emitting structure is viewed from above the p-type semiconductor layer. The p-type electrode pad may be disposed adjacent to an edge of the light emission surface. The first n-type electrode finger may have a form in which the first n-type electrode finger is extended from the n-type electrode pad to an edge of the light emission surface, opposing an edge on which the p-type electrode pad is located, to then branch in two directions along edges of the light emission surface. The second n-type electrode finger may have a form in which the second n-type electrode finger is extended from the n-type electrode pad in two different directions and the portions thereof extended in two directions are then respectively bent toward the edge of the light emission surface on which the p-type electrode pad is located. The p-type electrode finger may have a form in which the p-type electrode finger is extended from the p-type electrode pad to branch in two directions, along edges of the light emission surface and bypasses a position in which the n-type electrode pad is located, and is then bent toward a portion of the first n-type electrode finger extended from the n-type electrode pad to an edge of the light emission surface.

According to an exemplary embodiment of the present disclosure, a semiconductor light emitting device may include an n-type semiconductor layer, an active layer and a p-type semiconductor layer disposed in a first region corresponding to a portion of an upper surface of the n-type semiconductor layer, an n-type electrode disposed in a second region distinct from the first region on the n-type semiconductor layer to be electrically connected to the n-type semiconductor layer and including an n-type electrode pad and an n-type electrode finger, and a p-type electrode disposed on the p-type semiconductor layer to be electrically connected to the p-type semiconductor layer and including a p-type electrode pad and first and second p-type electrode fingers. The n-type semiconductor layer, the active layer and the p-type semiconductor layer may configure a light emitting structure. The p-type electrode pad may be disposed inside of a light emission surface provided when the light emitting structure is viewed from above the p-type semiconductor layer. The n-type electrode pad may be disposed adjacent to an edge of the light emission surface. The first p-type electrode finger has a form in which the first p-type electrode finger is extended from the p-type electrode pad to an edge of the light emission surface, opposing an edge on which the n-type electrode pad is located, to then branch in two directions along edges of the light emission surface. The second p-type electrode finger may have a form in which the second p-type electrode finger is extended from the p-type electrode pad in two different directions and the portions thereof extended in two directions are then respectively bent toward the edge at which the n-type electrode pad is located, on the light emission surface. The n-type electrode finger may have a form in which the n-type electrode finger is extended from the n-type electrode pad to branch in two directions, along edges of the light emission surface, and then bypasses a position in which the p-type electrode pad is located, and is then bent toward a portion of the first p-type electrode finger extended from the p-type electrode pad to an edge of the light emission surface.

The light emission surface may have a circular form or a polygonal form. For example, the light emission surface may have a rectangular form.

The n-type pad and the p-type pad may be located on a conceptual straight line passing through a center of the light emission surface.

The n-type electrode and the p-type electrode may have symmetricity based on a conceptual straight line passing through a center of the light emission surface.

An end of the p-type electrode finger may be formed in a position corresponding to a position at which the second n-type electrode finger is bent toward the p-type electrode pad, spaced apart from the second n-type electrode finger.

An end of the n-type electrode finger may be formed in a position corresponding to a position at which the second p-type electrode finger is bent toward the n-type electrode pad, spaced apart from the second p-type electrode finger.

A portion of the second n-type electrode finger, bent toward the p-type electrode pad, may be parallel to a portion of the p-type electrode finger.

A portion of the second p-type electrode finger, bent toward the n-type electrode pad, may be parallel to a portion of the n-type electrode finger.

The p-type electrode may further include a second p-type electrode finger extended from the p-type electrode pad toward the n-type electrode pad.

The second p-type electrode finger and the second n-type electrode finger may be parallel to each other, and a distance from an end of the second p-type electrode finger to the n-type electrode pad may be equal to that between the second n-type electrode finger and the second p-type electrode finger.

The second p-type electrode finger, and a portion of the first n-type electrode finger, extended from the n-type electrode pad to an edge of the light emission surface, may be located on the same level of a single conceptual straight line.

The n-type electrode may further include a second n-type electrode finger extended from the n-type electrode pad toward the p-type electrode pad.

The second n-type electrode finger and the second p-type electrode finger may be parallel to each other, and a distance from an end of the second n-type electrode finger to the p-type electrode pad may be equal to that between the second p-type electrode finger and the second n-type electrode finger.

The second n-type electrode finger, and a portion of the first p-type electrode finger, extended from the p-type electrode pad to an edge of the light emission surface, may be located on the same level of a single conceptual straight line.

The semiconductor light emitting device may further include a transparent electrode formed between the p-type electrode and the p-type semiconductor layer.

The n-type and p-type electrodes may include two or more n-type and p-type electrode pads, respectively.

The n-type and p-type electrode pads may oppose each other, as a pair.

Advantageous Effects

By using a semiconductor light emitting device according to an exemplary embodiment of the present disclosure, a phenomenon in which a current is concentrated in a specific region of an electrode may be significantly reduced by allowing for a uniform distance between n-type and p-type electrodes. In addition, the level of a driving voltage may be lowered by positioning electrode pads of n-type and p-type electrodes relatively close to each other.

DESCRIPTION OF DRAWINGS

The above and other aspects, features and other advantages will be more clearly understood from the following detailed description taken in conjunction with the accompanying drawings, in which.

BEST MODE FOR INVENTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 1:
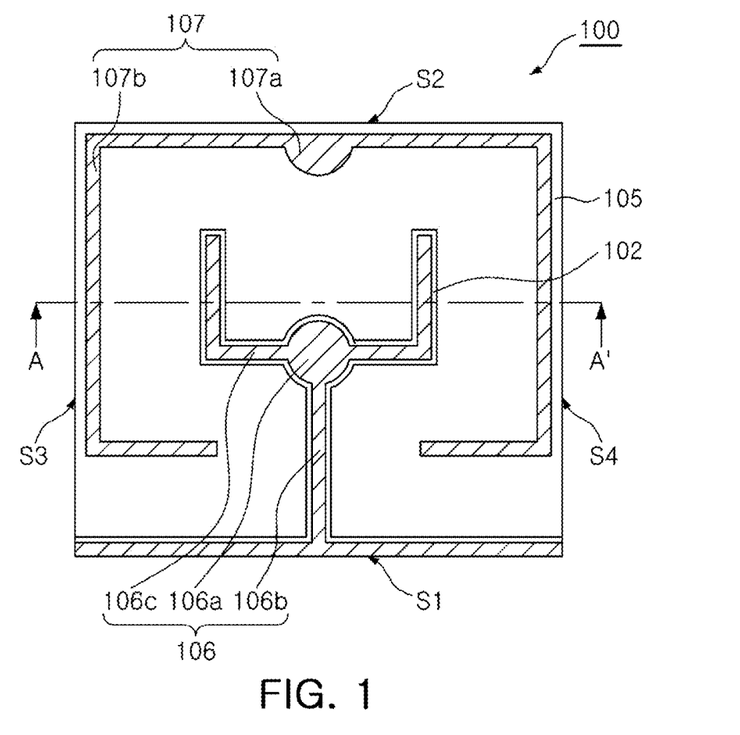
FIG. 1 is a plan view schematically illustrating a semiconductor light emitting device according to an embodiment of the present disclosure.
Figure 2:
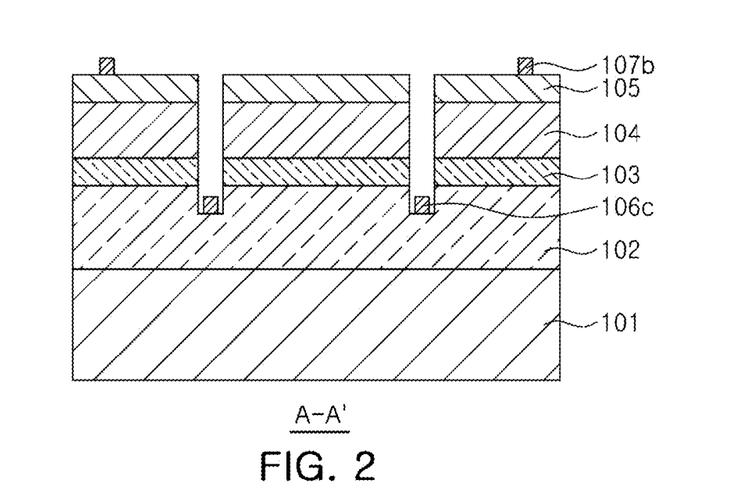
FIG. 2 is a cross-sectional view of a semiconductor light emitting device taken along line A-A' of FIG. 1.

FIG. 1 is a plan view schematically illustrating a semiconductor light emitting device according to an embodiment of the present disclosure. FIG. 2 is a cross-sectional view of a semiconductor light emitting device taken along line A-A' of FIG. 1. With reference to FIGS. 1 and 2, a semiconductor light emitting device 100 according to an embodiment of the present disclosure may include a light emitting structure formed on a substrate 101. Here, the light emitting structure may have a structure in which an n-type semiconductor layer 102, an active layer 103 and a p-type semiconductor layer 104 are formed. In this case, although not shown in FIGS. 1 and 2, one or more buffer layers may be formed between the n-type semiconductor layer 102 and the substrate 101 so as to improve crystal properties of a semiconductor layer grown thereon.

A p-type electrode 107 may be formed on the p-type semiconductor layer 104. The p-type electrode 107 may be configured of a p-type electrode pad 107a and a p-type electrode finger 107b. In this case, although not necessarily required, a transparent electrode 105 having an ohmic contact performance and a current distribution performance may be formed between the p-type electrode 107 and the p-type semiconductor layer 104. The transparent electrode 105 may be formed of transparent conductive oxide such as indium tin oxide (ITO).

On an upper surface of the n-type semiconductor layer 102, an n-type electrode 106 may be formed in a region thereof in which the active layer 103 and the p-type semiconductor layer 104 are not formed, and the n-type electrode 106 may also be configured of an n-type electrode 106a and n-type electrode fingers 106b and 106c. On the other hand, although not shown in FIGS. 1 and 2, the light emitting structure may include a passivation layer using an insulating material on a surface thereof.

The substrate 101 may be provided to allow a nitride semiconductor single crystal to grow thereon. As the substrate 101, a substrate formed of a material such as sapphire, Si, ZnO, GaAs, SiC, $MgAl_2O_4$, MgO, $LiAlO_2$, $LiGaO_2$, GaN, or the like, may be used. In this case, sapphire may be a crystal having Hexa-Rhombo R3c symmetry, may have lattice constants of 13.001 Å and 4.758 Å in c-axis and a-axis directions, respectively, and may have a C (0001) plane, an A (1120) plane, an R (1102) plane and the like. In this case, since the C plane comparatively facilitates the growth of a nitride thin film and is stable at relatively high temperatures, sapphire may be mainly used for a growth substrate for a nitride semiconductor.

The n-type and p-type semiconductor layers 102 and 104 may be formed of a nitride semiconductor using a material having a composition of, for example, $Al_xIn_yGa_{(1-x-y)}N$ ($0 \leq x \leq 1$, $0 \leq y \leq 1$, and $0 \leq x+y \leq 1$). For example, a material such as gallium nitride (GaN), aluminum gallium nitride (AlGaN), indium gallium nitride (InGaN), or the like may be used. The active layer 103 formed between the n-type and p-type semiconductor layers 102 and 104 may emit light having a predetermined amount of energy through the recombination of electrons and holes. The active layer 103 may have a multiple quantum well (MQW) structure in which a quantum well layer and a quantum barrier layer are alternately stacked, for example, an InGaN/GaN structure. On the other hand, the n-type and p-type semiconductor layers 102 and 104 and the active layer 103 may be formed through a semiconductor layer growth process such as a publicly disclosed metal organic chemical vapor deposition (MOCVD) process, molecular beam epitaxy (MBE) process, hydride vapor phase epitaxy (HVPE) process, or the like.

In an exemplary embodiment, the n-type and p-type electrodes 106 and 107 may be appropriately located to allow for a current to be evenly distributed across the entire light emission surface. In detail, a distance between the n-type electrode 106 and the p-type electrode 107 may be maintained to be constant. Here, the light emission surface may be a rectangular surface as illustrated in FIG. 1 and may correspond to a surface provided when the light emitting structure is viewed from above the p-type semiconductor layer 104. However, a geometrically perfect rectangular form is not necessarily required in the present disclosure, and a form somewhat changed from the rectangular form may also be included in a range of the light emission surface according to an embodiment of the present disclosure. For example, a case in which a corner portion of a rectangular form is partially curved may be applied thereto. In addition, in embodiments to be described below with reference to FIGS. 8 and 9, the light emission surface may also have a polygonal form or a circular form.

Hereinafter, with reference to FIG. 1, the structure of the n-type and p-type electrodes 106 and 107 will be described in detail. In this case, four sides forming the light emission surface may be defined as first to fourth sides S1, S2, S3 and S4, and the first and second sides S1 and S2 may oppose each other, and the third and fourth sides S3 and S4 may be perpendicular thereto. As described above, the n-type electrode 106 may include the n-type electrode pad 106a and the n-type electrode fingers 106b and 106c. The n-type electrode pad 106a may have a relatively great width, for example, a width narrower than those of the n-type electrode fingers 106b and 106c, so as to be connected to a conductive wire and the like. The n-type electrode fingers 106b and 106c may have a conductive line structure extended from the n-type electrode pad 106a to allow for uniform current injection across the entire light emission surface. Although not necessarily required, the n-type electrode fingers 106b and 106c may have a relatively narrow width, for example, a width narrower than that of the n-type electrode pad 106a. In a similar manner thereto, the p-type electrode pad 107a may have a width greater than that of the p-type electrode finger 107b.

In an exemplary embodiment, the n-type electrode pad 106a may be located in a position nonadjacent to an edge of the light emission surface, and in further detail, may be located so as not to be adjacent to corner portions of the light emission surface and the first to fourth sides S1 to S4 thereof. As such, when the n-type electrode pad 106a is located in a position nonadjacent to an edge of the light emission surface, a distance between the n-type electrode pad 106a and the p-type electrode pad 107a may be relatively reduced, to reduce electrical resistance. Therefore, when the semiconductor light emitting device 100 is driven, a level of a driving voltage may be relatively reduced. The n-type electrode fingers 106b and 106c may be classified as a first n-type electrode finger 106b and a second n-type electrode finger 106c. First, the first n-type electrode finger 106b may have a structure in which it is extended from the n-type electrode pad 106a to the first side S1 to then be formed along the first side S1. The second n-type electrode fingers 106c may have a form in which they are extended from the n-type electrode pad 106a toward third and fourth sides S3 and S4, respectively, and are then bent toward the second side S2 before contacting the third and fourth sides S3 and S4, in further detail, so as not to contact the p-type electrode finger 107b. In this case, although not necessarily required, in order to maintain a distance between different types of electrodes to be constant, portions of the p-type electrode fingers 106c, bent toward the p-type electrode pad 107a, may be parallel to a portion of the p-type electrode finger 107b.

The p-type electrode 107 may be appropriately located to maintain a distance between the p-type electrode 107 and the n-type electrode 106 to be constant. First, the p-type electrode pad 107a may be formed adjacent to the second side S2, and may further be located in a position thereof corresponding to a position in which the n-type electrode pad 106a is located. In addition, the n-type pad and the p-type pad 106a and 107a may be formed on the same level, for example, on a conceptual straight line formed by connecting central points of the first and second sides S1 and S2, such that a distance between the pads may be significantly reduced and symmetricity in the electrode structure may be secured. The p-type electrode fingers 107b may have a form in which they are extended from the p-type electrode pad 107a toward the third and fourth sides S3 and S4 along the second side S2 and are then bent and formed along the third and fourth sides S3 and S4, respectively, so as not to contact the first n-type electrode finger 106b. In further detail, the p-type electrode fingers 107b may have a form bent toward a portion of the first n-type electrode finger 106b extended from the n-type electrode pad 106a to the first side S1 before contacting the first side S1.

In this case, although not necessarily required, as illustrated in FIG. 1, an end of the p-type electrode finger 107b, in detail, an end of a portion thereof bent toward the portion extended from the n-type electrode pad 106a to the first side S1 may be located in a position corresponding to a position at which the second n-type electrode finger 106c is bent toward to the second side S2, to relatively further improve uniformity of the distance between the n-type electrode 106 and the p-type electrode 107. On the other hand, the n-type and p-type electrodes 106 and 107 may have horizontal symmetricity based on a conceptual straight line formed by connecting central points of the first and second sides S1 and S2 to each other.

In the case of the layout structure of the n-type and p-type electrodes 106 and 107 according to an exemplary embodiment, a distance between the n-type and p-type electrodes 106 and 107 may be maintained to be significantly constant. In the case of an electrode structure according to the related art (See FIGS. 5 and 6), a distance between n-type and p-type electrodes, for example, the maximum distance therebetween is twice the minimum distance therebetween. In this case, the electrodes were formed by not sufficiently considering a difference in widths of pads and fingers, and the like. In an exemplary embodiment, a distance between fingers may be maintained to be constant, and a distance between fingers and pads may also be constant so as not to be excessively adjacent to each other in a specific region. As such, a problem in which a current is partially concentrated may be significantly reduced by maintaining a distance between the n-type and p-type electrodes 106 and 107 to be constant, to improve current distribution performance and light emission efficiency. On the other hand, although FIG. 1 illustrates the case in which the n-type electrode fingers 106b and 106c and the p-type electrode finger 107b have a portion bent at 90 degrees, the forms thereof may be variously changed, for example, may be a form curved to have a curved line. For example, forms of bent portions of the n-type and p-type electrode fingers 106b, 106c and 107b may be variously changed. In addition, the n-type and p-type electrode pads 106a and 107a may have a different form such as a polygonal form as well as a spherical form or a hemispherical form.

Figure 3:
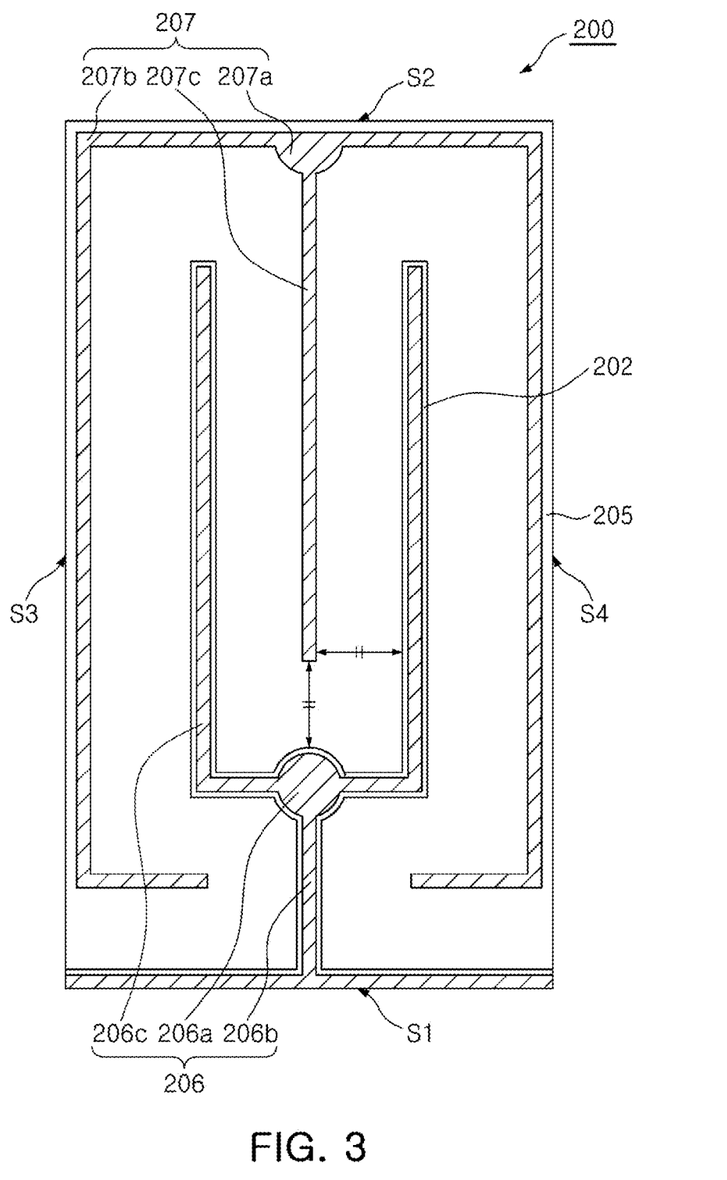
FIG. 3 is a schematic plan view of a semiconductor light emitting device according to another embodiment of the present disclosure.

FIG. 3 is a schematic plan view of a semiconductor light emitting device according to another embodiment of the present disclosure. With reference to FIG. 3, a semiconductor light emitting device 200 according to an exemplary embodiment has a basic structure similar to that of the embodiment of FIG. 1. For example, an n-type electrode 206 formed on an n-type semiconductor layer 202 may include an n-type electrode pad 206a and n-type electrode fingers 206b and 206c having a form similar to that of the structure of FIG. 1. Further, a p-type electrode 207 formed on a transparent electrode 205 may include a p-type electrode pad 207a and p-type electrode fingers 207b and 207c. In an exemplary embodiment, a light emission surface may have a vertically long rectangular form as compared with that in the structure of FIG. 1. In this rectangular form case, the p-type electrode finger may be classified as first and second p-type electrode fingers 207b and 207c such that a current may be uniformly injected into the rectangularly formed light emission surface.

The second p-type electrode finger 207c added to the present embodiment may be extended from the p-type electrode pad 207a toward the n-type electrode pad 206a and may allow for a uniform distance between the n-type and p-type electrodes 206 and 207. To this end, the second p-type electrode finger 207c may be parallel to the second n-type electrode finger 206c, and a linear distance from an end of the second p-type electrode finger 207c to the n-type electrode pad 206a may be the same as that between the second n-type electrode finger 206c and the second p-type electrode finger 207c, for example, as illustrated in FIG. 3. Further, the second p-type electrode finger 207c may be formed on the same level as that of a portion of a second n-type electrode finger 206b extended from the n-type electrode pad 206a to the first side S1, for example, may be formed on a single conceptual straight line formed by connecting central points of the first and second sides S1 and S2, in order to secure horizontal symmetricity.

Figure 4:
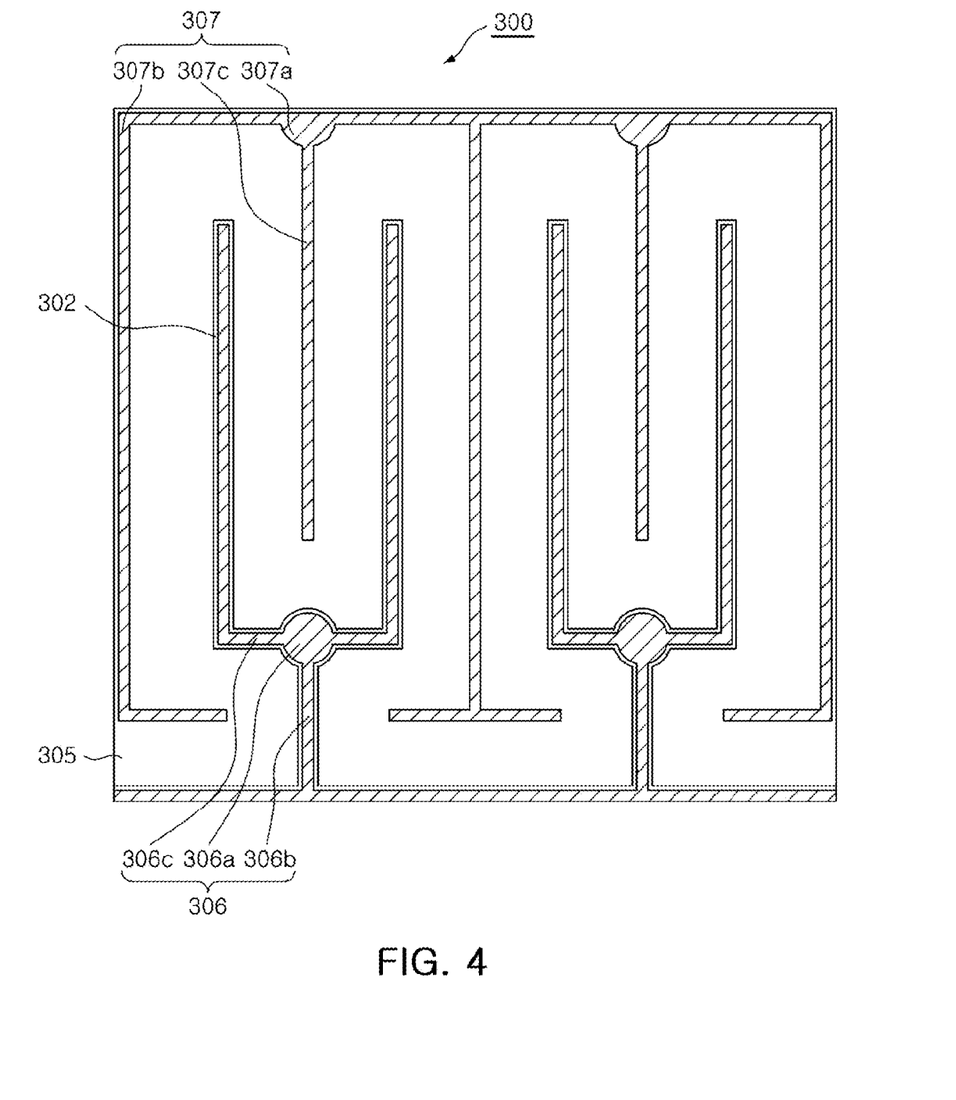
FIG. 4 is a plan view schematically illustrating a semiconductor light emitting device according to another embodiment of the present disclosure.

Meanwhile, with regard to a rectangularly formed light emission surface having a horizontally further extended form, a uniform current distribution may be implemented by forming two or more n-type and p-type electrode pads. FIG. 4 is a plan view schematically illustrating a semiconductor light emitting device according to another embodiment of the present disclosure. With reference to FIG. 4, a semiconductor light emitting device 300 according to the embodiment has a basic structure similar to that of the foregoing embodiment of FIG. 3. For example, an n-type electrode 306 formed on an n-type semiconductor layer 302 may include an n-type electrode pad 306a and n-type electrode fingers 306b and 306c, and a p-type electrode formed on a transparent electrode 305 may include a p-type electrode pad 307a and p-type electrode fingers 307b and 307c. In an exemplary embodiment, a light emission surface may have a horizontally extended form as compared to the structure of FIG. 3. In order to uniformly inject a current into the light emission surface having the extended form as described above, the n-type electrode pads 306a and the p-type electrode pads 307a may be provided in respective two. In this case, the amount of the n-type electrode pad 306a and the p-type electrode pad 307a may be further increased as needed.

In a similar manner to the foregoing embodiment, the n-type and p-type electrode pads 306a and 307a may be appropriately located so as to secure symmetricity and a uniform distance therebetween. In detail, as illustrated in FIG. 4, two or more n-type electrode pads 306a may be formed on a conceptual straight line parallel to the first side or the second side, and in a similar manner thereto, two or more p-type electrode pads 307a may be formed on a conceptual straight line parallel to the first side or the second side. In this case, among two or more n-type and p-type electrode pads 306a and 307a, electrode pads corresponding to each other may be located in positions corresponding to each other, and in detail, may be located on a conceptual straight line perpendicular to the second side. As such, even when an area of the light emission surface is relatively increased, the amounts of the n-type electrode pads 306a and the p-type electrode pads 307b may be increased together, to maintain a distance between electrodes having different polarities to be constant. Except for such a difference, the forms of the n-type electrode fingers 306a and 306c and the p-type electrode fingers 307b and 307c may be similar to those in the foregoing embodiment.

Figure 5:
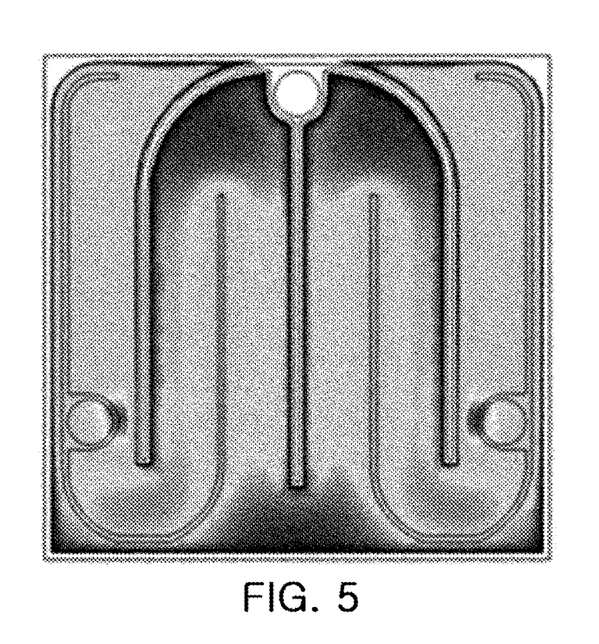
FIGS. 5 to 7 illustrate simulation results with respect to current density distribution in a light emitting device to inspect a performance in an electrode structure having a form according to an embodiment of the present disclosure.
Figure 6:
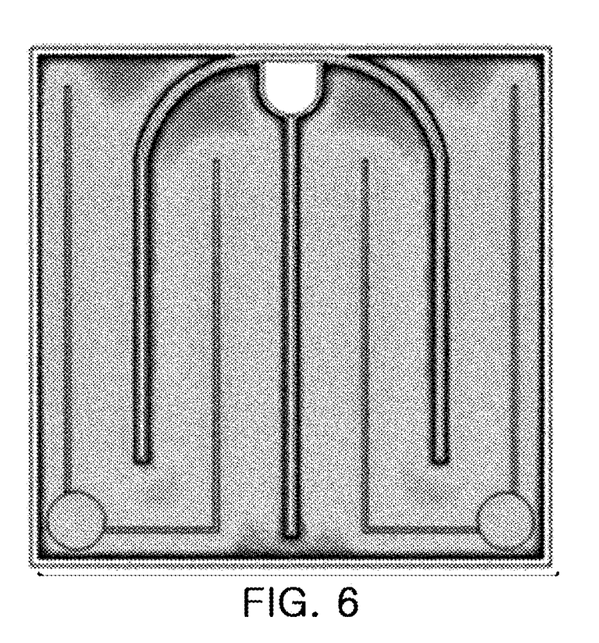
Figure 7:
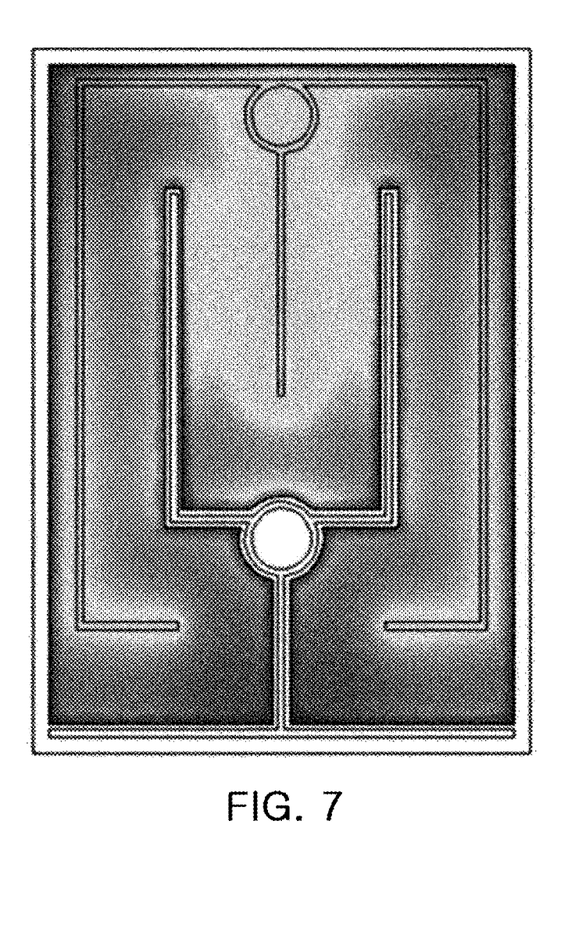

FIGS. 5 to 7 illustrate simulation results with respect to current density distribution in a light emitting device to inspect performance in an electrode structure having a form according to an embodiment of the present disclosure. The simulation results indicate that current density is increased from blue toward red. In this case, FIG. 7 refers to the embodiment of the present disclosure (the structure described with reference to FIG. 1), and FIGS. 5 and 6 refer to comparative examples. First, in the case of an electrode structure illustrated in FIG. 5, an n-type electrode pad is located adjacent to one side of a light emission surface to increase a level of a driving voltage as compared to the case of the present embodiment. Furthermore, a distance between an n-type electrode and a p-type electrode is not constant. In detail, a region in which an n-type electrode pad and a p-type electrode finger are relatively adjacent to each other is present in this case, and in this region, a current is concentrated (in a red portion) and light emitting device reliability may be deteriorated. Next, in the case of the electrode structure illustrated in FIG. 6, a distance between electrodes having different polarities is relatively constant as compared to the electrode structure of FIG. 5, but the layout thereof is considered as being inappropriate to cause a phenomenon of current concentration in the n-type finger.

As compared to the case described above, in the case of an embodiment of the present disclosure with reference to FIG. 7 having the electrode structure of FIG. 1, although a relatively high current density is formed in portions of a p-type electrode pad and a p-type electrode finger, it can be appreciated that uniformity of current distribution is significantly improved across the entire light emission surface as compared to the comparative examples. The uniformity of current distribution may be obtained by maintaining a distance between the n-type and p-type electrodes so as to be relatively significantly constant as described above.

Figure 8:
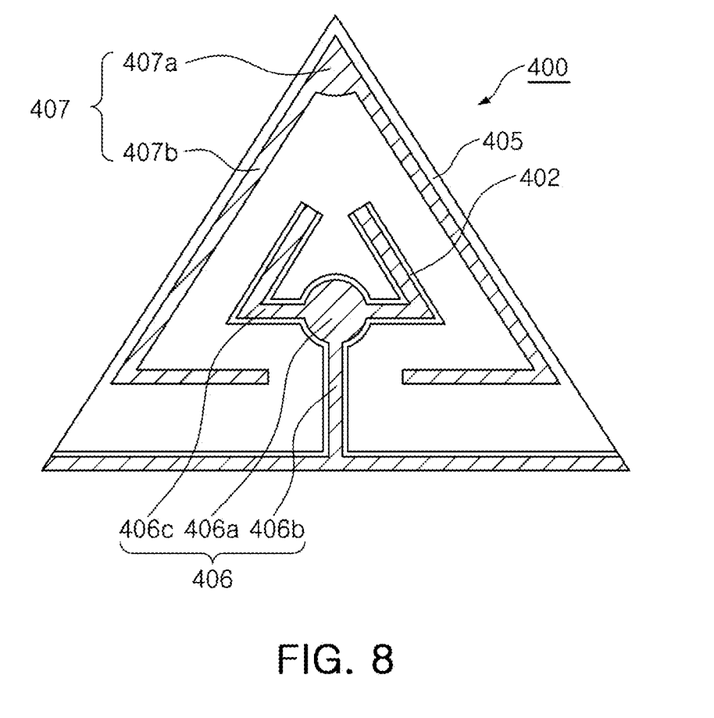
FIGS. 8 to 10 are plan views schematically illustrating semiconductor light emitting devices according to respective embodiments of the present disclosure.
Figure 9:
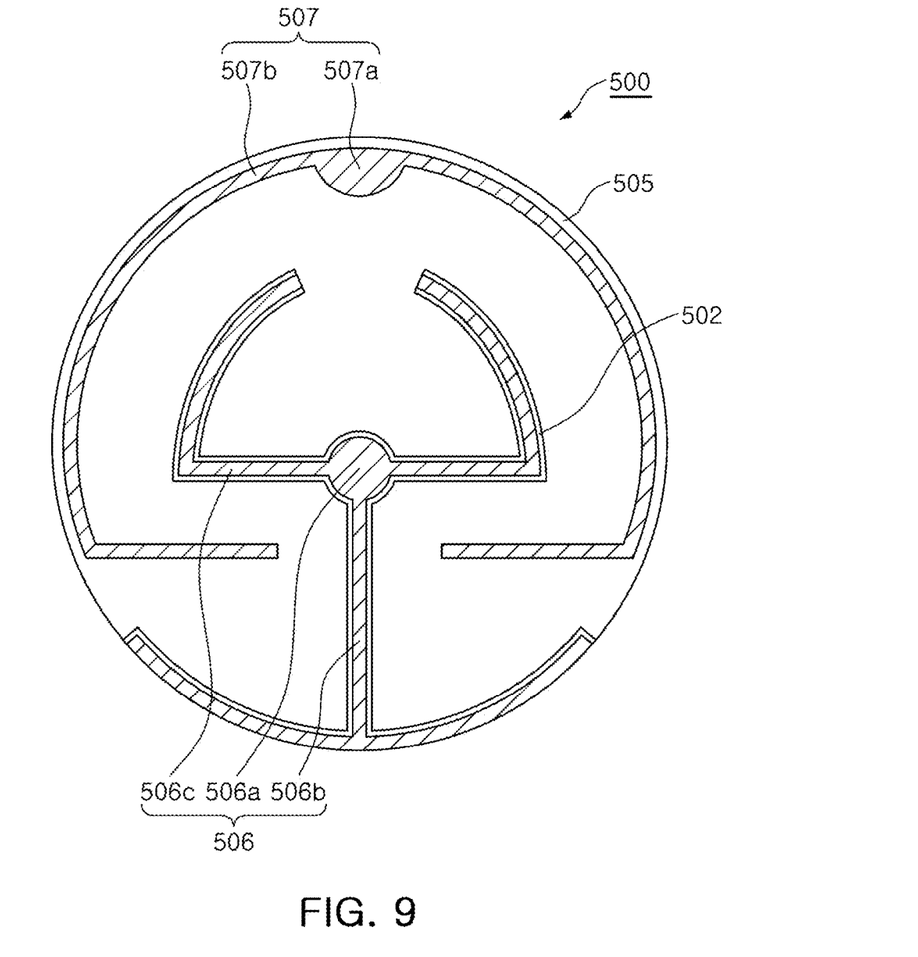

On the other hand, although the case in which the light emission surface has a rectangular form is illustrated in the above-mentioned embodiment, a form of the light emission surface may be variously changed while having the similar electrode structure to the description above. For example, the light emission surface may have a polygonal form, a circular form, or the like. Hereinafter, cases in which the light emission surface has a triangle form and has a circular form will be described. FIGS. 8 and 9 are plan views schematically illustrating semiconductor light emitting devices according to embodiments of the present disclosure. First, in the case of an embodiment with reference to FIG. 8, in a similar manner to the above-mentioned embodiment, a semiconductor light emitting device 400 may include an n-type electrode 406 formed on an n-type semiconductor layer 402. Here, the n-type electrode 406 may include an n-type electrode pad 406a and n-type electrode fingers 406b and 406c. In addition, a p-type electrode 407 formed on a transparent electrode 405 may include a p-type electrode pad 407a and a p-type electrode finger 407b. In an exemplary embodiment, a light emission surface may have a triangular form, and in this case, a distance between electrodes having different polarities may be maintained to be constant as possible by changing forms of the n-type and p-type electrodes 406 and 407 so as to be suitable for the triangular form structure.

In detail, the n-type electrode pad 406a may be formed in a region nonadjacent to an edge of the light emission surface, and the p-type electrode pad 407a may be formed on an edge of the light emission surface, for example, maybe located adjacent to one apex of the triangularly formed light emission surface. In addition, the first n-type electrode finger 406b may have a form in which it is extended from the n-type electrode pad 406a to an edge of the light emission surface, opposing an edge on which the p-type electrode pad 407a is located, to then branch in two directions along edges of the light emission surface. The branched second n-type electrode fingers 406c may have a form in which they are extended from the n-type electrode pad 406a in two different directions and the portions thereof extended in two directions are then respectively bent toward the edge at which the p-type electrode pad 407a is located, for example, toward the apex described above.

The p-type electrode finger 407b may have a form in which it is extended from the p-type electrode pad 407a to branch in two directions, along edges of the light emission surface and then bypasses a position in which the n-type electrode pad 406a is located, and is then bent toward a portion of the first n-type electrode finger 406b extended from the n-type electrode pad 406a to an edge of the light emission surface. In this case, as described in the foregoing embodiment, the n-type and p-type electrode pads 406a and 407a may be formed on the same level so as to be located on a conceptual straight line passing through a center of the light emission surface. An overall structure of the n-type and p-type electrodes 406 and 407 may have symmetricity based on a conceptual straight line passing through a center of the light emission surface. In addition, although not shown in the drawing, a p-type electrode finger may further be formed to be extended from the p-type electrode pad 407a toward the n-type electrode pad 406a, in a similar manner to the embodiment of FIG. 3.

Next, in the case of an embodiment with reference to FIG. 9, similar to the foregoing embodiment, a semiconductor light emitting device 500 may include an n-type electrode 506 formed on an n-type semiconductor layer 502. Here, the n-type electrode 506 may include an n-type electrode pad 506a and n-type electrode fingers 506b and 506c. In addition, a p-type electrode 507 formed on a transparent electrode 505 may include a p-type electrode pad 507a and a p-type electrode finger 507b. In an exemplary embodiment, a light emission surface may have a circular form, and in this case, a distance between electrodes having different polarities may be maintained to be constant as possible by changing forms of the n-type and p-type electrodes 506 and 507 so as to be suitable for the circular form structure.

In detail, the n-type electrode pad 506a may be formed in a region nonadjacent to an edge of the light emission surface, and the p-type electrode pad 507a may be formed on an edge of the light emission surface, for example, may be located in a region adjacent to a circumference of the circularly formed light emission surface. In addition, the first n-type electrode finger 506b may have a form in which it is extended from the n-type electrode pad 506a to an edge of the light emission surface, opposing an edge on which the p-type electrode pad 507a is located, to then branch in two directions along edges of the light emission surface. The branched second n-type electrode fingers 506c may have a form in which they are extended from the n-type electrode pad 506a in two different directions and the portions thereof extended in two directions are then respectively bent toward the edge at which the p-type electrode pad 507a is located on the light emission surface.

The p-type electrode finger 507b may have a form in which it is extended from the p-type electrode pad 507a to branch in two directions, along edges of the light emission surface and then bypasses a position in which the n-type electrode pad 506a is located, and is then bent toward a portion of the first n-type electrode finger 506b extended from the n-type electrode pad 506a to an edge of the light emission surface. In this case, in a similar manner to the foregoing embodiment, the n-type and p-type electrode pads 506a and 507a may be formed on the same level so as to be located on a conceptual straight line passing through a center of the light emission surface. An overall structure of the n-type and p-type electrodes 506 and 507 may have symmetricity based on a conceptual straight line passing through a center of the light emission surface. In addition, although not shown in the drawing, a p-type electrode finger may further be formed to be extended from the p-type electrode pad 507a toward the n-type electrode pad 506a, in a similar manner to the embodiment of FIG. 3.

On the other hand, while the foregoing embodiments illustrate cases in which the n-type electrode pad is formed in a region nonadjacent to an edge of the light emission surface and the p-type electrode pad is formed on an edge of the light emission surface, the p-type electrode pad may be formed in a region nonadjacent to an edge of the light emission surface, and the n-type electrode pad may be formed on an edge of the light emission surface.

Figure 10:
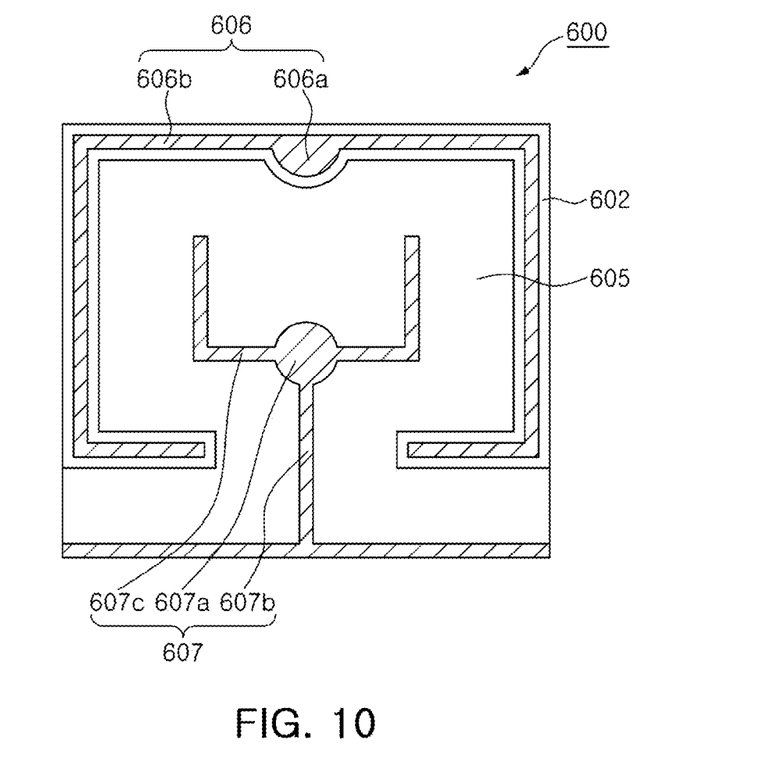

FIG. 10 is a plan view schematically illustrating a semiconductor light emitting device according to another embodiment of the present disclosure. With reference to FIG. 10, in the case of an electrode structure provided in a semiconductor light emitting device 600, although an overall form thereof is similar to that of the embodiment of FIG. 1, n-type and p-type electrodes 606 and 607 may be located in respectively opposite positions with respect to the embodiment of FIG. 1. For example, the n-type electrode 606 may be formed on an n-type semiconductor layer 602, and the n-type electrode 606 may include an n-type electrode pad 606a and an n-type electrode finger 606b. In addition, the p-type electrode 607 formed on a transparent electrode 605 may include a p-type electrode pad 607a and p-type electrode fingers 607b and 607c. In an exemplary embodiment, the p-type electrode pad 607a may be located in a region nonadjacent to an edge of a light emission surface, and the n-type electrode pad 606a may be located on an edge of the light emission surface, for example, in a region adjacent to one side of a rectangularly formed light emission surface. A first p-type electrode finger 607b may have a form in which it is extended from the n-type electrode pad 607a to an edge of the light emission surface, opposing an edge on which the n-type electrode pad 606a is located, to then branch in two directions along edges of the light emission surface. The branched second p-type electrode fingers 607c may have a shape in which they are extended from the p-type electrode pad 607a in two different directions and the portions thereof extended in two directions are then respectively bent toward the edge at which the n-type electrode pad 606a is located on the light emission surface.

The n-type electrode finger 606b may have a form in which it is extended from the n-type electrode pad 606a to branch in two directions, along edges of the light emission surface and then bypasses a position in which the p-type electrode pad 607a is located, and is then bent toward a portion of the first p-type electrode finger 607b extended from the p-type electrode pad 607a to an edge of the light emission surface. In this case, similar to the foregoing embodiment, the n-type and p-type electrode pads 606a and 607a may be formed on a conceptual straight line passing through a center of the light emission surface. An overall structure of the n-type and p-type electrodes 606 and 607 may have symmetricity based on a conceptual straight line passing through a center of the light emission surface. In addition, although not shown in the drawing, a p-type electrode finger may further be formed to be extended from the n-type electrode pad 606a toward the p-type electrode pad 607a, in a similar manner to the embodiment of FIG. 3.

While the present disclosure has been shown and described in connection with the embodiments, it will be apparent to those skilled in the art that modifications and variations can be made without departing from the spirit and scope of the present disclosure as defined by the appended claims.

The invention claimed is:

1. A semiconductor light emitting device comprising:
an n-type semiconductor layer;
an active layer and a p-type semiconductor layer disposed in a first region corresponding to a portion of an upper surface of the n-type semiconductor layer;
an n-type electrode disposed in a second region distinct from the first region on the n-type semiconductor layer to be electrically connected to the n-type semiconductor layer and including an n-type electrode pad and first and second n-type electrode fingers; and
a p-type electrode disposed on the p-type semiconductor layer to be electrically connected to the p-type semiconductor layer and including a p-type electrode pad and a p-type electrode finger,
wherein the n-type semiconductor layer, the active layer and the p-type semiconductor layer configure a light emitting structure, the n-type electrode pad is disposed inside of a light emission surface provided when the light emitting structure is viewed from above the p-type semiconductor layer, and the p-type electrode pad is disposed adjacent to an edge of the light emission surface,
the first n-type electrode finger has a form in which the first n-type electrode finger is extended from the n-type electrode pad to an edge of the light emission surface, opposing an edge on which the p-type electrode pad is located, to then branch in two directions along edges of the light emission surface, and the second n-type electrode finger has a form in which the second n-type electrode finger is extended from the n-type electrode pad in two different directions and the portions thereof extended in two directions are then respectively bent toward the edge of the light emission surface on which the p-type electrode pad is located, and
the p-type electrode finger has a form in which the p-type electrode finger is extended from the p-type electrode pad to branch in two directions, along edges of the light emission surface and bypasses a position in which the n-type electrode pad is located, and is then bent toward a portion of the first n-type electrode finger extended from the n-type electrode pad to an edge of the light emission surface.

2. The semiconductor light emitting device of claim 1, wherein the light emission surface has a circular form or a polygonal form.

3. The semiconductor light emitting device of claim 2, wherein the light emission surface has a rectangular form.

4. The semiconductor light emitting device of claim 1, wherein the n-type pad and the p-type pad are located on a conceptual straight line passing through a center of the light emission surface.

5. The semiconductor light emitting device of claim 1, wherein the n-type electrode and the p-type electrode have symmetricity based on a conceptual straight line passing through a center of the light emission surface.

6. The semiconductor light emitting device of claim 1, wherein an end of the p-type electrode finger is disposed in a position corresponding to a position at which the second n-type electrode finger is bent toward the p-type electrode pad, spaced apart from the second n-type electrode finger.

7. The semiconductor light emitting device of claim 1, wherein a portion of the second n-type electrode finger, bent toward the p-type electrode pad, is parallel to a portion of the p-type electrode finger.

8. The semiconductor light emitting device of claim 1, wherein the p-type electrode further comprises a second p-type electrode finger extended from the p-type electrode pad toward the n-type electrode pad.

9. The semiconductor light emitting device of claim 8, wherein the second p-type electrode finger and the second n-type electrode finger are parallel to each other, and a distance from an end of the second p-type electrode finger to the n-type electrode pad is equal to that between the second n-type electrode finger and the second p-type electrode finger.

10. The semiconductor light emitting device of claim 8, wherein the second p-type electrode finger, and a portion of the first n-type electrode finger, extended from the n-type electrode pad to an edge of the light emission surface, are located on the same level of a single conceptual straight line.

11. The semiconductor light emitting device of claim 1, further comprising a transparent electrode disposed between the p-type electrode and the p-type semiconductor layer.

12. The semiconductor light emitting device of claim 1, wherein the n-type and p-type electrodes comprise two or more n-type and p-type electrode pads, respectively.

13. The semiconductor light emitting device of claim 12, wherein the n-type and p-type electrode pads oppose each other, as a pair.

14. A semiconductor light emitting device comprising:
an n-type semiconductor layer;
an active layer and a p-type semiconductor layer disposed in a first region corresponding to a portion of an upper surface of the n-type semiconductor layer;
an n-type electrode disposed in a second region distinct from the first region on the n-type semiconductor layer to be electrically connected to the n-type semiconductor layer and including an n-type electrode pad and an n-type electrode finger; and
a p-type electrode disposed on the p-type semiconductor layer to be electrically connected to the p-type semiconductor layer and including a p-type electrode pad and first and second p-type electrode fingers,
wherein the n-type semiconductor layer, the active layer and the p-type semiconductor layer configure a light emitting structure, the p-type electrode pad is disposed inside of a light emission surface provided when the light emitting structure is viewed from above the p-type semiconductor layer, and the n-type electrode pad is disposed adjacent to an edge of the light emission surface,
the first p-type electrode finger has a form in which the first p-type electrode finger is extended from the p-type electrode pad to an edge of the light emission surface, opposing an edge on which the n-type electrode pad is located, to then branch in two directions along edges of the light emission surface, and the second p-type electrode finger has a form in which the second p-type electrode finger is extended from the p-type electrode pad in two different directions and the portions thereof extended in two directions are then respectively bent toward the edge at which the n-type electrode pad is located, on the light emission surface, and
the n-type electrode finger has a form in which the n-type electrode finger is extended from the n-type electrode pad to branch in two directions, along edges of the light emission surface, and then bypasses a position in which the p-type electrode pad is located, and is then bent toward a portion of the first p-type electrode finger extended from the p-type electrode pad to an edge of the light emission surface.

15. The semiconductor light emitting device of claim 14, wherein an end of the n-type electrode finger is disposed in a position corresponding to a position at which the second p-type electrode finger is bent toward the n-type electrode pad, spaced apart from the second p-type electrode finger.

16. The semiconductor light emitting device of claim 14, wherein a portion of the second p-type electrode finger, bent toward the n-type electrode pad, is parallel to a portion of the n-type electrode finger.

17. The semiconductor light emitting device of claim 14, wherein the n-type electrode further comprises a second n-type electrode finger extended from the n-type electrode pad toward the p-type electrode pad.

18. The semiconductor light emitting device of claim 17, wherein the second n-type electrode finger and the second p-type electrode finger are parallel to each other, and a distance from an end of the second n-type electrode finger to the p-type electrode pad is equal to that between the second p-type electrode finger and the second n-type electrode finger.

19. The semiconductor light emitting device of claim 17, wherein the second n-type electrode finger, and a portion of the first p-type electrode finger, extended from the p-type electrode pad to an edge of the light emission surface, are located on the same level of a single conceptual straight line.

* * * * *